United States Patent [19]

Kim

[11] Patent Number: 4,910,534
[45] Date of Patent: Mar. 20, 1990

[54] LIGHT EMITTING APPARATUS

[75] Inventor: Bun-Joong Kim, Seoul, Rep. of Korea

[73] Assignee: Samsung Electronics Co., Ltd., Suwon, Rep. of Korea

[21] Appl. No.: 399,951

[22] Filed: Aug. 29, 1989

[30] Foreign Application Priority Data

Dec. 17, 1988 [KR] Rep. of Korea ............... 1988-16846

[51] Int. Cl.$^4$ ............................................. G01D 15/00
[52] U.S. Cl. ..................................... 346/155; 346/160
[58] Field of Search ............... 346/155, 139 C, 153.1, 346/150, 160; 358/300; 400/119

[56] References Cited

U.S. PATENT DOCUMENTS 4,766,448  8/1988  Hack et al. .......................... 346/155
4,779,108  10/1988  Inoue ................................... 346/155

Primary Examiner—Arthur G. Evans
Attorney, Agent, or Firm—Fleit, Jacobson, Cohn, Price, Holman & Stern

[57] ABSTRACT

A light emitting apparatus in a head of an non-impact printer using an array-mode semiconductor light emitting device and emitting a radiant light in parallel to the surface of a substrate. The improved device is capable of easily arranging a head substrate, a lens system, and a drum on a central axis thereof by adopting a method of emitting a light in parallel to said head substrate. To achieve the object the device comprises: a reflecting surface 8 formed by shaving one corner of a substrate 6 in a given angle of slope; a plurality of strip wires (W11, W12, ... ) disposed, in parallel and a fixed interval, on uppermost surface 11 of the substrate 6, said wires each extending towards said corner from the opposite side thereof; a common electrode wire 4 disposed on said uppermost surface in parallel with said wires; and a plurality of light emitting means each disposed lowermost surface of a plurality of light emitting chips (C1, C2, ... ), said light emitting means being disposed opposite to said reflecting surface maintaining said given angle therebetween, thereby light emitted from said light emitting means is reflected at said reflecting surface towards a direction according to said given angle.

6 Claims, 2 Drawing Sheets

LIGHT EMITTING APPARATUS

BACKGROUND OF THE INVENTION

This invention relates to a light emitting apparatus for use in a head of an non-impact printer using an array-mode semiconductor light emitting device, and particularly to a light emitting device for emitting a radiant light in parallel to the surface of a substrate.

In a prior copying machine and a printer, the array-mode semiconductor light emitting device is used for a light source, and the method of emitting a light to a drum means linearly is disclosed in Japanese Pat. Publication No. 1964-25849.

However, in the known method, the light is emitted in vertical to the head substrate. Therefore, there has been some disadvantages that the head substrate of a printer should move to the direction of the emission and said substrate surface should be maintained in vertical to the direction of the emission, when controlling the space between a lens system and a light source system. Moreover, if a peripheral equipment is complex and narrow, namely, in case that the components such as a charger, a toner, and a copying machine are arranged toward a central axis on the photosensitive rum surface, or the space for inserting the light emitting apparatus is small, the conventional light emitting system are not easily attached and a larger space is required.

In FIG. 1 showing partially a perspective diagram of the prior light emitting apparatus, the emitting surface 2 of the array-mode light emitting device is arranged in parallel with the wiring surface 11 of the printer head substrate 6. Then, each chip of the array-mode light emitting devices (C1, C2, ...) is die-bonded on the head substrate (meaningfully the substrate). Thereafter, pads (P11, P21, ... Pn1) of the light emitting device on each chip are connected with the wires (W11, W21, ...) on the head substrate 6 through a bonding wire 5. Said substrate 6 is in a mode of insulating plate such as a ceramic substrate, particularly of an alumina substrate, which may have a heat-sink on its back surface The wires (W11, W21, ...) are made of proper gold and copper pattern in single or multiple layer.

Then, a p-n junction is formed at the emitting surface 2 of a III or V family composite semiconductor such as GaAs or GaP substrate by a conventional method such as a diffusion or an epitaxial growth, so that a light emitting device chip (C1, C2, ...) are made.

Therefore, the light is emitted in vertical to the emitting portion 2, namely, in vertical to the surface of the head substrate 6. So, there occurs said difficulties in controlling the drum and lens system to be in order.

Besides, n case of using said method, a printer head comprises "m" number of chips and each chip comprises "n" number of light emitting elements Therefore, n x m times of wire bonding in total is necessary. In case of using a light-emitting head of 15 inches in its size having 400 DPI, it must meet a condition of n=128 dots/chip and m=48 chips/head. Moreover, 6144 times of wire bonding for the pad is required. So, a particular technique is needed for said wire bonding. In case of a high resolution printer above 400 DPI, said difficulties are more significant. Therefore, there is a problem in reliability in case of using said printer, because a short-circuit or a disconnection may be occurred frequently although wire bonding is possible.

BRIEF DESCRIPTION OF THE DRAWINGS

For a better understanding of the invention and to show how the same may be carried into effect, reference will now be made, by way of example, to the accompanying diagrammatic drawings, in which.

SUMMARY OF THE INVENTION

Figure 1:
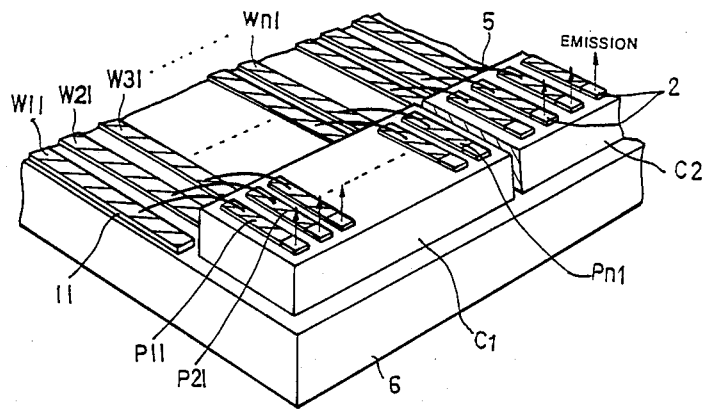
FIG. 1 shows a prior light emitting apparatus for use in a head of an non-impact printer.

An object of the present invention is to provide a light emitting device for use in a head of an non-impact printer.

Another object of the present invention is to provide a light emitting device capable of easily arranging a head substrate, a lens system, and a drum on a central axis thereof by adopting a method of emitting a light in parallel to said head substrate.

According to one aspect of the invention, the light emitting device in order to achieve the object comprises: a reflecting surface 8 formed by shaving one corner of a substrate 6 in a given angle of slope; a plurality of strip wires (W11, W12, ....) disposed, in parallel and a fixed interval, on uppermost surface 11 of the substrate 6, said wires each extending towards said corner from the opposite side thereof; a common electrode wire 4 disposed on said uppermost surface in parallel with said wires; and a plurality of light emitting means each disposed lowermost surface of a plurality of light emitting chips (C1, C2, ... ), said light emitting means being disposed opposite to said reflecting surface maintaining said given angle therebetween, thereby light emitted from said light emitting means is reflected at said reflecting surface towards a direction according to said given angle.

DETAILED DESCRIPTION OF THE INVENTION

The above and other objects, effects and features of the present invention will become more apparent from the following description of preferred embodiments thereof taken in conjunction with the accompanying drawings. Same reference numerals are used to designate similar parts throughout the figures.

Figure 2:
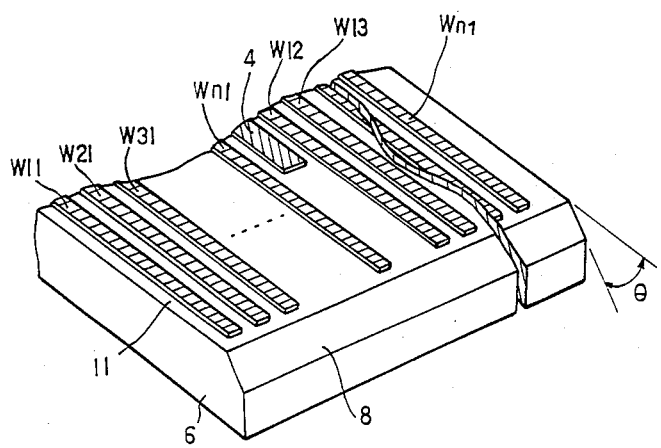
FIG. 2 shows a perspective diagram of a head substrate for an non-impact printer according to present invention.
Figure 3:
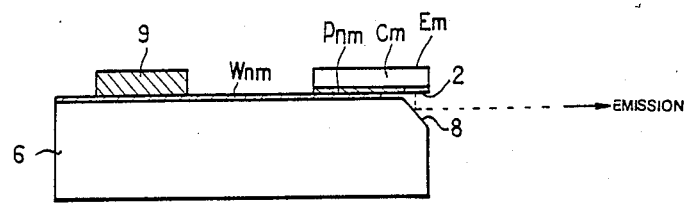
FIG. 3 shows a cross-sectional view of a light emitting apparatus for an non-impact printer according to present invention.
Figure 4:
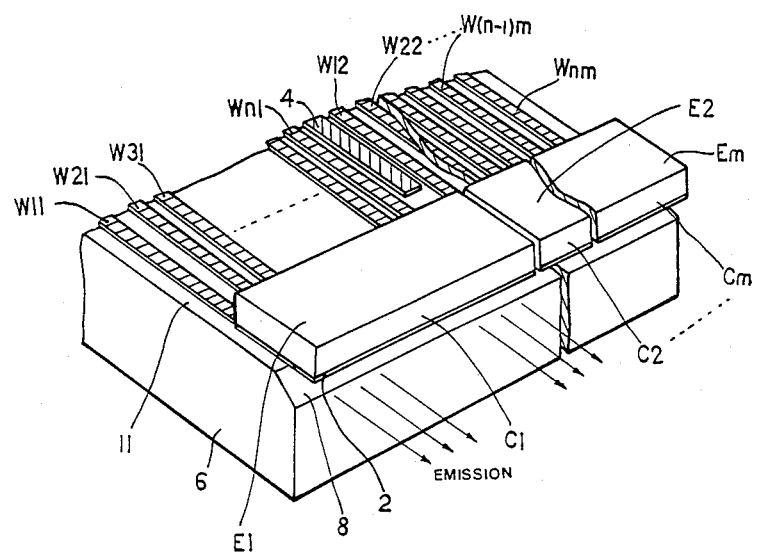

The FIG. 2 through FIG. 4 show a perspective diagram of the inventive head substrate, a cross-sectional view and a perspective diagram of the apparatus, respectively, according to the invention.

Referring to FIG. 2, a reflecting surface 8 with a given uniform angle (0 degree -90 degree) to the head substrate 6 is prepared at one corner of the head substrate of ceramic. Then, the wires (W11, W21, ...) are formed with the same pitch width as that of a bonding pad on a chip, up to a bound of the reflecting surface 8 so as to face-down bond the light emitting device chip, and a wire for a common electrode 4 is also formed.

Referring to FIG. 3 showing an cross-sectional view of the light emitting device according to present invention, a bonding pad (P11, P21, ...) of the array mode light emitting device chip 1 is contacted to the wire (W11, W21, ...) on the head substrate 6 which has a given pattern, and a motive IC 9 is bonded at the opposite side. It is also shown that the light emitted from the emitting portion 2 of the chip (C1 C2, ...) is reflected at the reflecting surface 8 and the light, if the angle between the substrate 6 and the reflecting surface 8 is set to be 45 degree, may be emitted in parallel to the wiring surface 11.

In FIG. 4 showing a perspective diagram according to the present light emitting apparatus, the light emitting chip (C1, C2, ...) is face-down bonded on the head substrate 6 so that the light emitted from each chip (C1, C2, ... ,Cm) is reflected at the reflecting surface 8. Hence, the common wire 4 established at least more than one per chip (C1, C2, ... ,Cm) is wire-bonded with a common electrode (top surface of the chip, E1, E2, ..., Em) of each chip, or the common electrode (E1, E2, ... Em) of the each chip is connected by ribbon-bonding technique without the common wire 4, and the common electrode is formed to connect it to the outside terminal.

The inventive head substrate 6 such as that of the prior art is made of a thin/thick ceramic plate useful in insulating and sustaining the device or any other material which can be used to form a thin/thick film pattern. Thereafter on said substrate the wire (W11, W21, W31, ..., Wn1, Wn2, ..., Wnm, 4) for connecting the light emitting device (C1, C2, ...) and the operating IC 9 can be formed by a technique of forming a thin/thick film. In this case, a single layer or multi-layer of a good conductivity of copper, gold and aluminum are used as the wiring material, and a pattern is formed on the substrate by the techniques of photolithography and etching.

The pad region is formed by bonding the chip with AuSn or by using a particular material such as a soldering paste. If the electrode material of two pads is Au/Au, then AuSn, Au or Ag-epoxy is used for said material, whereas if it is Cu/Au or Al/Au, then AuSn, PbSn, Ag-epoxy or other material is used.

The reflecting (or mirror) surface 8 is formed in following process. One corner of he substrate is shaved at a given angle to the substrate surface by a general method such as pressing, shaving, and sintering process. Then, the inclined surface is selectively coated with a good reflecting material such as Au or Al. Further, in some case a thin layer such as SiO2 or CeO2 may be used for the coating material. In this case the angle is usually 45 degree or, according to the requirement, may be in a given range from 0 degree to 90 degree.

Next, each manufactured light emitting device chip (C1, C2, ...) is arranged in accordance with the wire (W11, W21, ...) by a conventional or an IR (Infrared Ray) arranging machine, and, then, face-down bonded. In addition, the bonding wire is connected to the common wire 4 or each common electrode (E1, E2,...) is ribbon-bonded together, and drawn out in order to connect the common electrode of each chip with one another.

In this way, the bonding wires are significantly decreased in number from n x m to the several times of the chip number, or the ribbon bonding numbers become decrease in one or two. Besides, the light emitted from the emitting portion 2 is reflected at the reflecting surface 8 and, therefore, it can be emitted in parallel to the head substrate surface 6.

In the light emitting apparatus according to the present invention, the pad wire bonding number is decreased and the resolution is improved, compared with that of prior art. Namely, in case of A3 paper (in 297 mm) with 300 DPI font, 55 chips and 3520 dots (or 3520 pads) per head is required in the conventional art, whereas in the invention under the same condition if the number of the common electrode wire per chip becomes two, the wire bonding number can be decreased to 2×55=110 times.

In case of a double column array-mode of 400 DPI font, the wiring width is 100 m in the prior art. However, in the invention the width becomes about 55 m so that, if the current technique is enough developed up to the wire width of 20 m and with the space of 20 m, the resolution can be improved up to 635 DPI font. Besides, most of heat is generated at the portion of p-n junction in the invention, so that the p-n junction can be placed near the head substrate which is the heating source. Therefore the heat is generated more easily, causing the stable operation of the device by the effect of the heat radiation. The arrangement of the head substrate becomes easier by keeping the light emitting direction parallel to the substrate surface.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A light emitting device for use in a non-impact printer, comprising:
   a reflecting surface 8 formed by shaving one corner of a substrate 6 in a given angle of slope;
   a plurality of strip wires (W11, W12, ...) disposed, in parallel and a fixed interval, on uppermost surface 11 of the substrate 6, said wires each extending towards said corner from the opposite side thereof;
   a common electrode wire 4 disposed on said uppermost surface in parallel with said wires; and
   a plurality of light emitting means each disposed lowermost surface of a plurality of light emitting chips (C1, C2, ...), said light emitting means being disposed opposite to said reflecting surface maintaining said given angle therebetween, thereby light emitted from said light emitting means is reflected at said reflecting surface towards a direction according to said given angle.

2. The light emitting device according to claim 1, wherein the angle formed between the reflecting surface 8 and the light emitting means 2 ranges from zero degree to ninety degrees, preferably forty-five degrees, so that the light emitted from the light emitting means is reflected in parallel to the substrate.

3. The light emitting device according to claim 1, wherein, for a substrate made of ceramic insulator, said reflecting surface 8 of the substrate is coated with one of either Aluminum, Copper, Silver, or Gold thin/thick film.

4. The light emitting device according to claim 1, wherein, for a substrate coated with insulator on a conductive heat-radiating plate thereof, said reflecting surface itself is polished or coated with one of either Aluminum, Copper, Silver, or Gold thin/thick film.

5. The light emitting device according to claim 1, wherein a thin film of either silicon nitride, silicon oxide, or cerium oxide is secondly coated over said reflecting surface.

6. The light emitting device according to claim 1, wherein, for a substrate coated with insulator, said substrate is Aluminum, Duralumin, Copper, or Copper compound having a characteristic of high-intensity, said insulator being one of either Polychlorinated biphenyl (PCB) insulating resin or Spin-on-Glass (SOG).

* * * * *